United States Patent [19]

Specht et al.

[11] 4,366,228
[45] Dec. 28, 1982

[54] PHOTOPOLYMERIZABLE COMPOSITIONS FEATURING NOVEL CO-INITIATORS

[75] Inventors: Donald P. Specht; Conrad G. Houle; Samir Y. Farid, all of Rochester, N.Y.

[73] Assignee: Eastman Kodak Company, Rochester, N.Y.

[21] Appl. No.: 262,675

[22] Filed: May 11, 1981

Related U.S. Application Data

[60] Division of Ser. No. 184,606, Sep. 5, 1980, Pat. No. 4,289,844, which is a continuation-in-part of Ser. No. 49,661, Jun. 18, 1979, abandoned.

[51] Int. Cl.$^3$ .............................................. G03C 1/68
[52] U.S. Cl. .................................. 430/281; 430/913; 430/916; 430/920; 204/159.15; 204/159.18; 204/159.23; 252/426
[58] Field of Search ............... 430/281, 913, 916, 920; 252/426; 204/159.15, 159.18, 159.23, 159.24

[56] References Cited

U.S. PATENT DOCUMENTS

| | | |
|---|---|---|
| Re. 28,789 | 3/1976 | Chang . |
| 3,203,801 | 8/1965 | Heiart . |
| 3,488,269 | 1/1970 | Allen et al. . |
| 3,573,922 | 4/1961 | Rust . |
| 3,650,927 | 3/1972 | Levinos . |
| 3,682,641 | 8/1972 | Casler et al. . |
| 3,729,404 | 4/1973 | Morgan . |
| 3,759,807 | 9/1973 | Osborn . |
| 3,933,682 | 1/1976 | Bean . |
| 4,017,313 | 4/1977 | Hartzler . |
| 4,134,811 | 1/1979 | De Poortere et al. . |
| 4,147,552 | 4/1979 | Spechet et al. . |
| 4,278,751 | 7/1981 | Specht et al. . |
| 4,289,844 | 9/1981 | Specht et al. . |

FOREIGN PATENT DOCUMENTS

| | | |
|---|---|---|
| 1467645 | 3/1977 | United Kingdom . |
| 1469643 | 6/1977 | United Kingdom . |
| 1476536 | 6/1977 | United Kingdom . |

OTHER PUBLICATIONS

J. Oil Col. Chem. Assoc., 59, pp. 157 & 162–164 (1976).
International Symposium on Advances in Photopolymer Systems, 1978.
J. of Amer. Chem. Soc., vol. 97, pp. 4139–4141, Jul. 9, 1975.

*Primary Examiner*—Jack P. Brammer
*Attorney, Agent, or Firm*—Dana M. Schmidt

[57] ABSTRACT

A photopolymerizable composition, element and method of photopolymerizing the composition or element are disclosed wherein the composition comprises an addition polymerizable compound containing ethylenic unsaturation and a co-initiator including a photopolymerization activator and photosensitizer.

In one aspect of the invention, the photosensitizer is selected to be a coumarin having an absorption maximum between about 250 and about 550 nm, and a

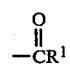

substituent in the 3-position wherein $R^1$ is alkyl or alkenyl having 1–12 carbon atoms, or a carboxylic or heterocyclic group having 5–20 nuclear carbon and hetero atoms, the coumarin and the activator being present in an amount sufficient to provide, when the compound is coated, dried and exposed to a medium-pressure mercury light source, a speed which is at least about one-fifth that of the same composition coated, dried and exposed identically except with a co-initiator consisting of Michler's ketone and benzophenone.

In another aspect of the invention, the activator is selected to have the structure:

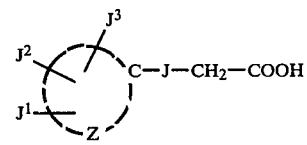

wherein:
J is —O—, —S— or a carbon-to-carbon bond;
$J^1$, $J^2$, and $J^3$ are each independently hydrogen; alkyl, alkoxy, or alkylthio having from 1 to 5 carbon atoms; aryloxy having from 6 to 10 carbon atoms; halogen; or any two of $J^1$, $J^2$, and $J^3$ taken together comprise the atoms necessary to complete a 5- or 6-membered fused heterocyclic or aromatic ring; and
Z is the number of atoms necessary to complete a heterocyclic or aromatic ring of from 4 to 6 ring atoms.

8 Claims, No Drawings

PHOTOPOLYMERIZABLE COMPOSITIONS FEATURING NOVEL CO-INITIATORS

This application is a division of Ser. No.184,606 filed 9/5/80, now U.S. Pat. No. 4,289,844, which is a continuation-in-part of Ser. No. 49,661, filed 6/18/79, now abandoned.

FIELD OF THE INVENTION

This invention relates to co-initiators used to photoinitiate the polymerization of addition-polymerizable compounds containing ethylenic unsaturation.

BACKGROUND OF THE INVENTION

Mixed photoinitiators, sometimes known as co-initiators, have been disclosed for use with polymerizable monomers. Co-initiators usually comprise two compounds, a light-sensitive compound usually identified as a photosensitizer, and an activator compound which in the presence of the photosensitizer is not significantly directly excited by the activating radiation, but instead forms a free radical in response to the exposure of the photosensitizer. The known classes of such activators include amines, sulfinic acid and sulfinic acid esters, sulfones, α- and β-dicarbonyls such as bornanedione and acetylacetone, phosphines, phosphites, stannates and hexaarylbi-imidazoles.

An early example of a very effective co-initiator system has been Michler's ketone as the photosensitizer, admixed with benzophenone as the activator, e.g., as described in U.S. Pat. No. 3,682,641. This mixture has long been considered an industry standard. More recently a number of aromatic carbonyl compounds have been disclosed as useful with amine activators to form co-photoinitiators of many kinds. Such mixtures are described by Ledwith, *J. Oil Col. Chem. Assoc.*, 59, p. 157, and especially p. 162-164 (1976). The carbonyls specifically identified are phenones, including cyclic ketones, such as benzophenone, fluorenones, anthraquinones and anthrones.

Such co-initiators have been highly effective in photopolymerization compositions of various kinds. However, notwithstanding such extensive uses, there has been a continued need to achieve still faster speeds through the discovery of novel co-initiator systems. That is, faster speeds result either in reduced exposure times or reduced amounts of exposure intensity, both of which are beneficial to the user.

U.S. Pat. No. 4,147,552 issued Apr. 3, 1979, discloses 3-substituted coumarin compounds as photosensitizers for photocrosslinkable and photopolymerizable ethylenically unsaturated compounds. The patent further mentions sensitizing mixtures of the coumarins with other compounds including specifically 3,3'-carbonyl-bis-(7-diethylaminocoumarin) (cols. 20-21), benzene chromium tricarbonyl and a tribromomethylated polymer (Example 14), particularly for the crosslinking of polymers. Although these photosensitizing mixtures have been found to be useful, specific speed improvements from these mixtures are reported in the patent as generally resulting from the speed provided by the coumarin alone.

SUMMARY OF THE INVENTION

In accordance with the present invention there is advantageously featured a co-initiator composition and photopolymerizable element containing an addition-polymerizable compound, which are improved to provide speeds which in many cases are superior to those available from conventional co-initiator compositions, e.g., Michler's ketone admixed with benzophenone.

In a related feature of the invention, such improved speeds are provided for a great variety of photopolymerization activators, both known and novel.

In yet another feature of the invention, improved polymerization efficiencies, i.e., greater degrees of polymerization, are achieved, at least with certain addition-polymerizable compounds.

In accord with one aspect of the invention, the aforesaid features are achieved by the use of an improved composition and an element using such composition, comprising a carbonyl compound and a photopolymerization activator responsive in the presence of the photo-excited form of the carbonyl compound to form a free radical, the activator being selected from the group consisting of an amine other than a 3-ketocoumarin amine, an acetic acid derivative, a phosphine, a phosphite, a bismuthine, an arsine, a stibine, a sulfinic acid, a sulfinic acid ester, a sulfone, an α- or β-dicarbonyl, a ketone, a bi-imidazole and a stannate. The improvement comprises the use of a coumarin as the carbonyl, such coumarin having an absorptive maximum between about 250 and about 550 nm and a

substituent in the 3-position wherein $R^1$ is alkyl or alkenyl having 1 to about 12 carbon atoms, or a carbocyclic or heterocyclic group having about 5 to about 20 nuclear carbon and hetero atoms, the coumarin and the activator being present in an amount sufficient to provide, when the composition is coated, dried and exposed to a medium-pressure mercury light source, a speed which is at least about one-fifth that of the same composition coated, dried and exposed identically except with a co-initiator consisting of Michler's ketone and benzophenone.

Such composition and element provide in many instances, when exposed to activating radiation, a photopolymerization speed not obtainable by conventional compositions.

In accord with another aspect of the invention, there is provided a co-initiator composition, and a photopolymerizable composition prepared therefrom, comprising a photosensitizer and an activator having the structure:

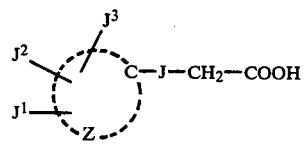

wherein:
J is —O—, —S— or a carbon-to-carbon bond;
$J^1$, $J^2$, and $J^3$ are each independently hydrogen; alkyl, alkoxy, or alkylthio having from 1 to 5 carbon atoms; aryloxy having from 6 to 10 carbon atoms; halogen; or any two of $J^1$, $J^2$, and $J^3$ taken together comprise the atoms necessary to complete a 5- or 6-membered fused heterocyclic or aromatic ring; and Z is the number of atoms necessary to complete a heterocyclic or aromatic ring of from 4 to 6 ring atoms.

Other features of the invention will become apparent upon reference to the following Description of the Preferred Embodiments.

DESCRIPTION OF THE PREFERRED EMBODIMENTS

The invention is based in part upon the discovery that certain coumarins are effective as the photosensitizer portion of a co-initiator composition which also includes a free-radical photopolymerization activator, in polymerizing addition-polymerizable compounds having ethylenic unsaturation with a speed which exceeds that achievable by the co-initiator composition of Michler's ketone and benzophenone. Further, novel activators have been discovered for use in a co-initiator composition comprising any photosensitizer. In many instances, it is believed that the speed far exceeds that which is available from any previously known co-initiator composition or system. This result is surprising, in light of the fact that a previously disclosed mixture of a coumarin with an amine compound, e.g., that of 3-benzoyl-7-methoxycoumarin and 3,3'-carbonylbis(7-diethylaminocoumarin), when used as a photoinitiator for the polymerization of such unsaturated compounds, produces a speed of only about 0.08 that of the speed produced by Michler's ketone plus benzophenone.

As used herein, a "co-initiator composition" is a subset of the class "photosensitizer" in that the former is used only to initiate addition polymerization of simple compounds or polymers. Without being limited to specific mechanisms, addition polymerization preferably involves the production of free radicals. Photosensitizers, on the other hand, include both compounds having the function of sensitizing a single-event crosslinking of photopolymers, as well as compounds having the function of activating addition polymerization of light-sensitive materials as just noted.

The term "addition-polymerizable" or "addition polymerization" refers to the chain reaction which occurs wherein a single photon causes the addition of more than one recurring unit, in contrast with single-event crosslinking wherein a single photon creates one, and only one, crosslink event.

As used herein, unless stated otherwise, "alkyl", "carbocyclic", "aryl", "aromatic" and "heterocyclic" include substituted, as well as unsubstituted, alkyl, carbocyclic, aryl, aromatic and heterocyclic, respectively. Suitable substituents include alkoxy containing from 1 to about 5 carbon atoms, such as methoxy, ethoxy, propoxy, butoxy and the like; sulfonates such as fluorosulfonate and the like; cyano; dialkylamino such as dimethylamino, diethylamino and the like; halo such as chloro, bromo and the like; nitro; hydroxy; and as substituents on a ring, alkyl of from 1 to about 5 carbon atoms, such as methyl, ethyl, propyl and the like. Also, alkenyl includes aryl- or alkyl-substituted alkenyl, for example, styryl, cinnamylidene-methyl, 2-(2-thienyl)vinyl and the like.

The photopolymerizable composition of the invention comprises an addition-polymerizable compound containing ethylenic unsaturation, and a co-initiator composition comprising an admixture of an appropriate photosensitizer and a photopolymerization activator responsive in the presence of the photo-excited photosensitizer. In one aspect of the invention, the photosensitizer is a 3-substituted ketocoumarin and the activator is selected from the group set forth in the Summary.

Any compound containing ethylenic unsaturation which is addition-polymerizable can be used in the invention. Preferred are simple compounds, or monomers as they are sometimes denominated, containing ethylenic unsaturation, as well as polymers containing end groups or pendant groups terminating with ethylenic unsaturation. For example, the phrase "addition polymerizable compounds" includes polymers having recurring units with the structure:

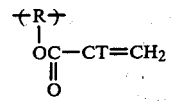

wherein:
R is any moiety capable of forming the backbone of a polymer and
T is hydrogen or methyl.

Other examples of useful addition-polymerizable compounds containing ethylenic unsaturation include monomeric acrylates, acrylamides, methacrylates, methacrylamides, allyl compounds, vinyl ethers, vinyl esters, N-vinyl compounds, styrenes and crotonates. Many examples of each of these classes are well-known, e.g., as listed in British Patent Specification No. 1,534,137 published Nov. 29, 1978, the details of which are expressly incorporated herein by reference. Still other useful addition-poolymerizable compounds are listed in U.S. Pat. No. 3,759,807 issued on Sept. 18, 1973, such as acrylonitrile and the like.

Highly preferred as addition-polymerizable compounds are the acrylate compounds as a class. Acrylates for years have been used in photopolymerization and a wide variety has been identified in the literature. Particularly useful examples include alkyl acrylates containing from 1 to about 10 and most preferably 1 to about 5 carbon atoms in the alkyl portion, such as methyl acrylate, ethyl methacrylate and the like; pentaerythritol tri- and tetraacrylates and methacrylates; esters of polyols including glycol diacrylates and dimethacrylates, such as tripropylene glycol diacrylates, tetraethylene glycol diacrylate, triethylene glycol dimethacrylate and the like; alkanediol diacrylates such as hexanediol diacrylates and the like; polyether diacrylates such as that obtainable from UCB, a division of Chimique Chaussee de Charleroi, Brussels, Belgium, under the trade name "Ebecryl 210"; and mixtures of the above.

Of the two components of the co-initiator composition, the one which preferably predominates as the light-absorbing component is the photosensitizer; that is, preferably greater than about 50% of the activating radiation, and in some cases, all of that radiation, is absorbed by the photosensitizer.

3-Ketocoumarin Photosensitizers

In accordance with one aspect of the invention, the photosensitizer is a 3-ketocoumarin bearing a variety of substituents adjacent the carbonyl group. Preferred coumarins are those that having the formula:

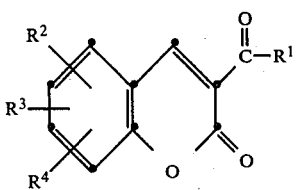

wherein:

R[1] is as defined above; and

R[2], R[3] and R[4] are the same or different and are each hydrogen; alkyl, mono- or dialkylamino, alkoxy, acyloxy, or alkoxycarbonyl containing from 1 to about 5 carbon atoms in the alkyl portion, such as methyl, ethyl, methylamino, dimethylamino, diethylamino, methoxy, ethoxy, n-propoxy, acetoxy and the like; aryl of from 6 to 10 nuclear atoms; hydroxy; a heterocyclic group of one or more saturated or unsaturated rings containing from about 5 to 20 ring atoms, for example, pyridyl, pyrrolinyl, pyrrolidyl and the like; or R[2] and R[3] or R[2]-R[4], when taken together, comprise the number of nonmetallic atoms which complete with the coumarin moiety an aryl ring or one or two fused saturated or unsaturated heterocyclic rings containing from about 5 to 10 ring atoms.

Useful examples illustrative of such latter fused heterocyclic rings include the structure:

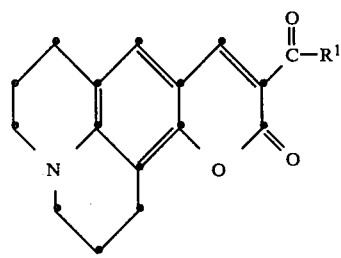

Of the moieties or substituents which can be selected as R[1], R[2], R[3] and R[4], particularly useful are those which are or contain polar moieties or substituents such as ionic moieties, and especially useful are water and/or alcohol-soluble moieties. Examples include, for R[1], heterocyclic onium salt groups, e.g., pyridinium salt, imidazolium salts and the like, and groups containing solubilizing substituents such as a carboxylate salt, sulfonate salt, quaternized N,N,N-trisubstituted ammonium salt, e.g., an N-phenylene-N,N,N-trimethylammonium chloride, and the like. Examples for R[2], R[3], and R[4] include groups containing substituents such as carboxy, carboxyalkyl, carboxyaryl, sulfo, sulfoalkyl, sulfoaryl and the monovalent metal or ammonium (including tetraorganoammonium) salts of said carboxy and sulfo substituents, and quaternary ammonium salt groups such as are noted in the previous sentence.

Examples of heterocyclic groups for R[1] also include benzofuryl, thienyl, thenyl, furyl, pyridyl, the p-toluenesulfonate salt of an N-methylpyridinium-3-yl group and the like. Additional preferred examples of such heterocyclic groups are 3,3′-carbonylbis(coumarins).

The 3-ketocoumarins substituted in the benzo portion of the coumarin structure by an amine group will produce, when admixed with certain activators, excellent speed for photopolymerizable monomers. As described and claimed in commonly owned U.S. application Ser. No. 95,171 filed Nov. 16, 1979, by Farid et al, entitled "Photopolymerization Co-Initiator Compositions Comprising Amine-Substituted Ketocoumarins and Acetic Acid Derivative Activators", such ketocoumarins provide the advantage of significant absorption at the spectral lines 366, 405, 436 and 547 nm, which allows the use of broad spectral light sources such as xenon, mercury or halogen lamps, as well as strong absorption at 488 nm which allows the use of argon laser exposure.

The following is a listing of coumarins highly useful as one of the components of the co-initiator composition of the invention;

3-(2-benzofuroyl)-7-diethylaminocoumarin;
3-(2-benzofuroyl)-7-(1-pyrrolidinyl)coumarin;
3-benzoyl-7-diethylaminocoumarin;
3-(o-methoxybenzoyl)-7-diethylaminocoumarin;
3-(p-dimethylaminobenzoyl)-7-diethylaminocoumarin;
3,3′-carbonylbis(5,7-di-n-propoxycoumarin);
3,3′-carbonylbis(7-diethylaminocoumarin);
3-benzoyl-7-methoxycoumarin;
7-diethylamino-3-[3-(2-thienyl)acryloyl]coumarin;
3-(2-furoyl)-7-diethylaminocoumarin;
3-(p-diethylaminocinnamoyl)-7-diethylaminocoumarin;
7-methoxy-3-(3-pyridylcarbonyl)coumarin;
9-(7-diethylamino-3-coumarinoyl)-1,2,4,5-tetrahydro-3H, 6H, 10H[1]benzopyrano[6,7,8-i,j]quinolizine-10-one; which has the structure:

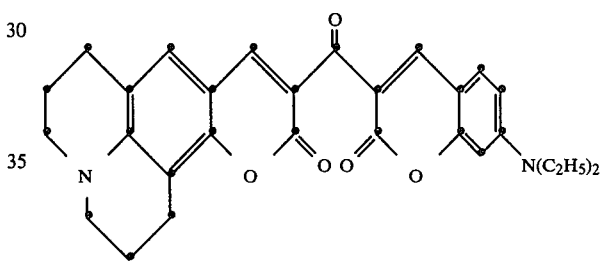

9-(7-di-n-propylamino-3-coumarinoyl)-1,2,4,5-tetrahydro-3H, 6H, 10H[1]benzopyrano[6,7,8-i,j]quinolizine-10-one;
9-(4-diethylaminocinnamoyl)-1,2,4,5-tetrahydro-3H, 6H, 10H[1]benzopyrano[6,7,8-i,j]quinolizine-10-one;
3-benzoyl-5,7-di-n-propoxycoumarin;
7-dimethylamino-3-[3-(2-thienyl)acryloyl]coumarin;
9-[3-(2-thienyl)acryloyl]-1,2,4,5-tetrahydro-3H, 6H, 10H[1]benzopyrano[6,7,8-i,j]quinolizine-10-one;
7-diethylamino-3-(4-dimethylaminocinnamylideneacetyl)coumarin;
9-[3-(9-julolidyl)acryloyl]-1,2,4,5-tetrahydro-3H, 6H, 10H[1]benzopyrano[6,7,8-i,j]quinolizine-10-one;
3-(p-cyanobenzoyl)-5,7-di-n-propoxycoumarin;
3,3′-carbonylbis(5,7-dibutoxycoumarin);
3,3′-carbonylbis(7-acetoxycoumarin);
5,7,7′-trimethoxy-3,3′-carbonylbiscoumarin;
3-cinnamoyl-7-diethylaminocoumarin;
7-diethylamino-3-(4-morpholinocinnamoyl)coumarin;
7-diethylamino-3-(4-ethoxycinnamoyl)coumarin;
3-(4-bromocinnamoyl)-7-diethylaminocoumarin;
7-diethylamino-3-[3-(4-methoxy-1-naphthyl)acryloyl]coumarin;
7-diethylamino-3-cinnamylideneacetyl coumarin;
9-[3-(2-thienyl)acryloyl]-1,2,4,5-tetrahydro-3H, 6H, 10H[1]benzopyrano[6,7,8-i,j]quinolizine-10-one;
7-diethylamino-3-(3-fluorosulfonylbenzoyl)coumarin;
3-(4-methoxybenzoyl)-5,7-di-n-propoxycoumarin;

3-(4-nitrobenzoyl)-5,7-di-n-propoxycoumarin;
3-(3-trifluoromethylbenzoyl)-5,7-di-n-propoxycoumarin;
3-(4-cyanobenzoyl)-7-diethylaminocoumarin;
3-benzoyl-5,7-dimethoxycoumarin;
7-diethylamino-3-(2-benzo[b]furoyl)coumarin;
3-benzoyl-5,7-diethoxycoumarin;
3-benzoyl-6-methoxycoumarin;
3-benzoyl-8-ethoxycoumarin;
3-benzoylbenzo[f]coumarin;
5,7-diethoxy-3-(2-thenoyl)coumarin;
3-(2-benzofuroyl)-5,7-diethoxycoumarin;
3-benzoyl-7-hydroxycoumarin;
7-acetoxy-3-benzoylcoumarin;
7-methoxy-3-(4-methoxybenzoyl)coumarin;
3-(4-fluorosulfonylbenzoyl)-7-methoxycoumarin;
3-(4-ethoxycinnamoyl)-7-methoxycoumarin;
3-benzoyl-7-dimethylaminocoumarin;
3-benzoyl-7-diethylaminocoumarin;
3-benzoyl-7-pyrrodinylcoumarin;
3-(4-iodobenzoyl)-7-dimethylaminocoumarin;
3-(4-iodobenzoyl)-7-diethylaminocoumarin;
7-dimethylamino-3-(4-dimethylaminobenzoyl)coumarin;
7-diethylamino-3-(4-nitrobenzoyl)coumarin;
7-diethylamino-3-(2-thenoyl)coumarin;
7-dimethylamino-3-(2-thenoyl)coumarin;
7-pyrrolidinyl-3-(2-thenoyl)coumarin;
7-dimethylamino-3-(2-furoyl)coumarin;
7-diethylamino-3-(2-methoxybenzoyl)coumarin;
3,3'-carbonylbiscoumarin;
3,3'-carbonylbis(7-methoxycoumarin);
3,3'-carbonylbis(6-methoxycoumarin);
3,3'-carbonylbis(5,7-dimethoxycoumarin);
3,3'-carbonylbis(5,7-diethoxycoumarin); and
3,3'-carbonylbis(5,7-di-isopropoxycoumarin).

A mixture of two or more of any of the above coumarins is useful, as are water-soluble 3-ketocoumarins such as 3-(7-methoxy-3-coumarinoyl)-1-methylpyridinium p-toluenesulfonate; 4-(7-methoxy-3-coumarinoyl)-N,N,N-trimethylanilinium fluorosulfonate; sodium 4-(7-methoxy-3-coumarinoyl)benzoate; sodium 4-(7-methoxy-3-coumarinoyl)benzenesulfonate; 3,3'-carbonylbis(sodium 6-coumarincarboxylate); and 3,3'-carbonylbis(6-coumarincarboxylic acid).

Conventional methods can be used to prepare these coumarins. For example, preparations are disclosed in the aforesaid U.S. Pat. No. 4,147,552.

Activators

The free-radical photopolymerization activator used in the composition of this invention is selected from the group consisting of amines other than a 3-ketocoumarin amine, acetic acid derivatives, phosphines, phosphites, bismuthines, arsines, stibines, sulfinic acid and sulfinic acid esters, sulfones, α- and β-dicarbonyls, such as 2,3-bornanedione and acetylacetone, ketones such as fluorenone and 1,4-quinones, bi-imidazoles, and stannates. Of this list, most are known activators for use with other sensitizers. Representative patents detailing numerous examples of such known activators include U.S. Pat. Nos. 3,488,269; 3,573,922; 3,650,927; 3,729,404; and 3,933,682. In addition, Michler's ketone, heretofore known to be a photosensitizer only, is believed to function in this invention as an activator, at least in some instances, when used with the coumarin sensitizers of this invention. Also, it is believed that the nitrogen-free acetic acid derivative activators herein described have not been recognized heretofore as activators for use with any sensitizer.

Preferred activators are those which produce, with the photosensitizer, a speed equal to or better than that of Michler's ketone and benzophenone used as the coinitiator system. Thus, many amine activators are preferred, and particularly the following, when used with selected coumarins of the invention:

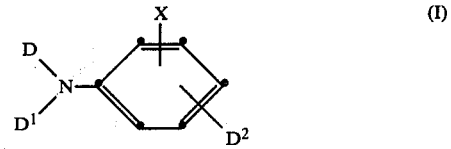

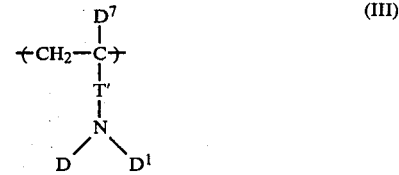

$$D^8-\overset{\overset{D^9}{|}}{\underset{\underset{D^{11}}{|}}{C}}-D^{10} \quad \text{(IV)}$$

wherein:
  D and $D^1$ are the same or different and are each alkyl containing from 1 to about 12 carbon atoms, such as methyl, ethyl, propyl and the like; or together they are the necessary atoms to form with the nitrogen atom one or more heterocyclic rings having about 5 to 10 nuclear atoms;
  $D^2$ is the group —COOD$^5$; the group

hydroxyalkyl or carboxyalkyl such as hydroxymethyl, hydroxyethyl and the like; alkyl containing from 1 to 3 carbon atoms, such as methyl, ethyl, propyl and the like; X; or formyl;
  $D^3$ is hydrogen; hydroxyalkyl, carboxyalkyl or alkyl containing from 1 to about 12 carbon atoms, such as methyl, ethyl, propyl and the like; or aralkyl containing from 1 to 3 carbon atoms in the alkyl portion and 6 to 10 carbon atoms in the aryl portion, such as benzyl and the like;
  $D^4$ is hydroxyalkyl, carboxyalkyl or alkyl or aralkyl containing from 1 to about 12 carbon atoms in the alkyl portion and 6 to 10 carbon atoms in the aryl portion, such as benzyl and the like;
  $D^5$ is aryl of from 6 to 10 nuclear carbon atoms or hydroxyalkyl, carboxyalkyl or alkyl containing from 1 to about 15 carbon atoms, such as methyl, propyl, isopropyl, butyl, octyl and the like, including alkyl substituted with aryl such as phenyl, or substituted with 2-phthalimido or with:

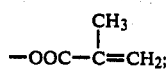

or is the group;

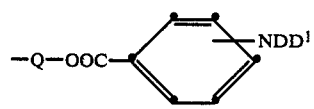

wherein:
D and $D^1$ are as described above and Q is a linking group such as alkylene, unsaturated alkylene, phenylenebisalkylene and the like;

$D^6$ is alkyl containing from 1 to about 3 carbon atoms, such as methyl, ethyl, propyl and the like; aryl of from 6 to 10 nuclear carbon atoms, e.g., p-dialkylaminophenyl; or is the group —$CH_2CO_2D$;

$D^7$ is hydrogen or alkyl containing from 1 to about 3 carbon atoms, such as methyl, ethyl, propyl and the like;

$D^8$–$D^{10}$ are each independently aryl, at least two of which are dialkylaminoaryl;

$D^{11}$ is hydrogen, or alkyl or alkenyl of from 1 to 8 carbon atoms;

X is hydrogen or halogen such as chlorine, bromine and the like; and

T' is a linking group connecting the amine moiety to the backbone of the polymer recurring unit, such as an alkylene ester containing 1 to about 5 carbon atoms.

Representative useful amines falling within structures (I) through (IV) above include ethyl p-dimethylaminobenzoate; other esters of p-dimethylaminobenzoic acid, e.g., n-butyl p-dimethylaminobenzoate, phenethyl p-dimethylaminobenzoate, 2-phthalimidoethyl p-dimethylaminobenzoate, 2-methacryloyloxyethyl p-dimethylaminobenzoate, pentamethylenebis (p-dimethylamino)benzoate; 4,4'-bis(-dimethylamino) benzophenone; phenethyl and pentamethylene esters of m-dimethylaminobenzoic acid; p-dimethylaminobenzaldehyde; 2-chloro-4-dimethylaminobenzaldeyde; p-dimethylaminoacetophenone; p-dimethylaminobenzyl alcohol; ethyl (p-dimethylamino)benzoyl acetate; p-N-piperidinoacetophenone; 4-dimethylaminobenzoin; N,N-dimethyl-p-toluidine; N,N-diethyl-m-phenetidine; tribenzylamine; dibenzylphenylamine; N-methyl-N-phenylbenzylamine; p-bromo-N,N-dimethylaniline; tridodecylamine; and 4,4',4"-methylidynetris(N,N-dimethylaniline) (crystal violet, leuco base).

Still other amines which are useful as activators include those described in U.S. Pat. No. 4,133,909, e.g., dimethylaminoethyl acrylate, and U.S. Pat. No. 3,759,807 issued on Sept. 18, 1973, e.g., alkanolamines such as methyl diethanolamine.

In the case of amines of the structure (III) above, a particularly useful class is latex polymeric particles prepared as described *Research Disclosure*, Publication No. 15930, July, 1977, except that the polymer is modified to include pendant amines. When using such a latex, hydrophobic coumarins can be loaded into the latex to provide a water-dispersible composition for coating.

A preferred preparation of such latex polymer particles having pendant amines is described in Example 82 that follows. Alternatively, for a greater oleophilic coating, such as would be useful in a litho plate, the polymer can be prepared in a similar manner using, however, no 2-hydroxyethyl methacrylate comonomer.

Another preferred class of activators is that of acetic acid derivatives having a structure:

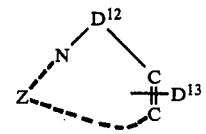

or

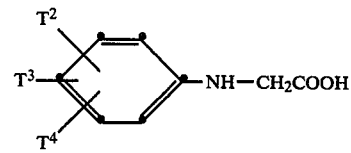

wherein:
$D^{12}$ is hydrogen or alkyl of from 1 to 4 carbon atoms, e.g., methyl, ethyl or the like;

$D^{13}$ is carboxylated alkyl of from 1 to 4 carbon atoms, e.g., carboxymethyl, carboxyethyl or the like;

Z is the number of atoms necessary to complete one or more substituted or unsubstituted heterocyclic rings having from about 5 to about 9 nuclear atoms; and $T^2$, $T^3$ and $T^4$ are the same or different and are each hydrogen or an electron-donating group such as alkyl, alkoxy, dialkylamino-containing from 1 to about 4 carbon atoms; or alkylthio ether containing from 1 to about 5 carbon atoms in the alkyl portion; e.g., methyl, isobutyl, methoxy, propoxy, dimethylamino, diethylamino, methylthio, ethylthio and the like; and hydroxy.

Highly preferred activators of the above formulas (I) through (VI) are coumarin-free activators such as N-phenylglycine; 3-indolacetic acid; N-methyl-3-indolacetic acid; ethyl and butyl dimethylaminobenzoate; N-methyl-N-benzylaniline; N,N-dimethyl-p-toluidine; p-hydroxymethyl-N,N-dimethylaniline and N,N-dibenzylaniline.

Yet another, and novel, class of activators found to be useful with 3-ketocourmarin photosensitizers, as well as other photosensitizers, is that of activators having the acetic acid structure (I) set forth in the Summary, wherein examples of $J^1$, $J^2$, and $J^3$ include methyl, ethyl, propyl, isopropyl, methoxy, ethoxy, propoxy, methylthio, phenoxy, naphthoxy, chlorine, fluorine, iodine and the like. As noted, any two of $J^1$, $J^2$, and $J^3$ can complete a 5- to 6-membered fused hetero or carbocyclic ring such as a phenyl ring or a thienyl ring. The ring formed by Z can be, e.g., phenyl, thienyl, and the like.

Particularly preferred examples of activator (I) include p-methoxyphenoxyacetic acid and p-methoxythiophenoxyacetic acid.

The other photosensitiziers with which the acetic acid activators of structure (I) are useful include thioxanthone, substituted thioxanthones, phenanthrene quinone, merocyanine dyes, such as thiazolines and selenazolines such as are described in U.S. Pat. No. 4,062,686, thiophenes, and chalcones.

With respect to phosphines as the activator, such phosphines can have the strucutre:

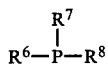

wherein $R^6$, $R^7$ and $R^8$ are the same or different and are each alkyl or alkoxy of from 1 to about 20 carbon atoms, for example, methyl, ethyl, isooctyl, dodecyl, methoxy, ethoxy, propoxy and the like; or aryl or alkaryl of from about 6 to 10 carbon atoms, e.g., phenyl, tolyl, naphthyl and substituted aryl as described above. Representative examples of such phosphines are listed in U.S. Pat. No. 3,729,404 issued on Apr. 24, 1973, the details of which are expressly incorporated herein by reference.

With respect to the dicarbonyls as the activator, useful particular examples include 2,3-bornanedione and acetylacetone, and 1,4-quinones such as anthraquinone and substituted anthraquinone.

A mixture of two or more activators of the types described above can also be used with the ketocoumarin photosensitizers described.

Not all free-radical photopolymerization activators will work with the coumarins of this invention to produce a speed which is at least 1/5 that achieved when using Michler's ketone and benzophenone as the coinitiators (and the previously stated light source). For comparison purposes, some combinations which have been found to fail to provide the above-noted minimum speed are, when used with a mixture of pentaerythritol tetraacrylate and pentaerythritol tetramethylacrylate as the polymerizable compound, p-dimethylaminobenzoate admixed with eitehr 7-diethylamino-3-(4-dimethylaminobenzoyl)coumarin, 9-(7dipropylamino-3-courmarinoyl)-1,2,4,5-tetrahydro-3H,6H,10H[1]benzopyrano[6,7,8-i,j]quinolizine-10-one or 7-diethylamino-3-(4-diethylaminocinnamoyl)courmarin.

Although preferably the activator absorbs less than 50% of the activating radiation, it is contemplated that activators, such as Michler's ketone, which absorb more than 50% can also be used, provided that at least some radiation is still absorbed by the photosensitizer.

The amount of photosensitizer used does not appear to be critical. Thus, the photosensitizer can be present in the range of about 0.002 to about 0.2 mmole per gram of dry-solids content. Actual preferred examples tested were in the range of from about 0.005 to about 0.015 mmole per gram.

Of course, sufficient activator needs to be present to allow the free-radical reaction to take place between the excited photosensitizer and the activator. Thus, the activator can be present in amounts between about 0.005 and about 2.0 mmoles per gram of dry solids, and preferably between about 0.05 and about 0.2.

The polymerizable compound is generally present from about 5 to about 100 weight percent of the mixture of that compound and the binder.

The dry thickness of the composition when coated can be between about 1 micron and about 1 mm, and is preferably between about 20 and about 120 microns.

The composition of the invention can be applied to a support for a variety of uses, by a wide variety of techniques such as spray-coating, whirler-coating, curtain-coating, roll-coating and the like, all of which are conventional.

Any suitable solvent can be selected for preparing a dope of the composition to be coated on the support. Typical examples include dichloromethane, acetone, benzene, alcohols, ethers, toluene and the like. The choice will depend, of course, upon the polymerizable compound and the activator selected, as well as upon other components which might be included, e.g., polymeric binders.

The support for the composition, if necessary at all, can be a variety of known materials, including photographic supports. Typical useful supports include polymeric film; wood fiber, e.g., paper; metallic sheet and foil; glass; and ceramic supporting elements provided with one or more subbing layers to enhance the adhesive, antistatic, dimensional, abrasive, hardness, frictional, and/or other properties of the support surface which might be desired.

Typical of useful polymeric film supports are films of cellulose nitrate and cellulose esters such as cellulose triacetate and diacetate, polystyrene, polyamides, homo- and copolymers of vinyl chloride, poly(vinyl acetal), polycarbonate, homo- and copolymers of olefins, such as polyethylene and polypropylene, and polyesters of dibasic aromatic carboxylic acids with divalent alcohols, such as poly(ethylene terephthalate).

Typical of useful paper supports are those which are partially acetylated or coated with baryta and/or a polyolefin, particularly a polymer of an α-olefin containing 2 to 10 carbon atoms, such as polyethylene, polypropylene, copolymers of ethylene and propylene and the like.

Further details of useful supports can be found in *Research Disclosure*, vol. 176, Publication No. 17643, Para. XVII (Dec., 197), published by Industrial Opportunities Ltd., Homewell, Havant, Hampshire, P091 EF, United Kingdon, the content of which is expressly incorporated herein by reference.

The compositions of the invention have utility in a wide variety of applications. For example, one embodiment of the invention is an element comprising a metallic support bearing the composition of the invention, preferably along with a polymeric binder. Particularly preferred metallic supports are copper foil. Such an element is useful in microelectronics and photofabrication, wherein the foil is etched into desired configurations. In such a use, the photopolymerizable compositions of the invention, together with a compatible binder, acts as a negative resist which is exposed and developed to form, for example, annular-shaped spacers for beam leads which are etched out of the metal foil using a positive-working resist for the beam-lead portions of the metal. As used herein, a binder is "compatible" if it forms with the coinitiator composition a single-phase coating, when dried, and does not interfere with the photoaddition polymerization capability of the composition. Certain examples of such a use as a negative resist are described in U.S. Pat. No. 3,795,043 issued on March 5, 1974, and more specifically in commonly owned U.S. application Ser. No. 49,662 filed on June 18, 1979, by John Guild, entitled "Black and Process for the Formation of Beam Leads for IC Chip Bonding".

When binders are desired as an additional component, they can be selected from, e.g, homopolymers, copolymers and terpolymers of polyacrylates, polyesters, poly(acrylic acid), mixtures of the same and the like. Such binders are not needed, however, even in resist applications, when the polymerizable compound and coinitiator composition are sufficiently film-forming in and of themselves, e.g., when the polymerizable compound is of a relatively high molecular weight such as an oligomer or a polymer.

Plasticizers can be included in the composition, depending upon the specific application intended. However, in at least some cases faster speeds are obtained by omitting them.

Additionally, the composition can be used to manufacture nonimaged polymeric coatings and other articles of manufacture.

EXAMPLES

The following examples further illustrate the nature of the invention.

Examples 1A and 1B

To demonstrate the marked increase in speed obtainable by the invention compared to the speed available from the conventional co-initiator off Michler's ketone and benzophenone, the two coatings were prepared by adding 13 ml of the following dope to the compounds of Table I:

| | |
|---|---|
| pentaerythritol tetraacrylate | 45.0 g |
| pentaerythritol tetramethacrylate | 60.0 g |
| t-butyl 4-hydroxy-5-methylphenyl sulfide (stabilizer) | 1.05 g |
| poly(methyl methacrylate-co-butyl methacrylate-co-acrylic acid) (34:63:3) available from Rohm & Haas under the trademark "Acryloid B48N" | 120. g |
| poly(methyl methacrylate) available from Rohm & Haas under the trademark "Acryloid A-11" | 120. g |
| dibutyl phthalate (plasticizer) | 50.4 g |
| dichloromethane solvent | 535.2 g |

TABLE I

| | Amounts | |
|---|---|---|
| | Example 1A | Example 1B |
| 3-benzoyl-5,7-di-n-propoxycoumarin | 0.08 mmole | — |
| 3-(2-benzofuroyl)-7-(1-pyrrolidinyl)coumarin | — | 0.08 mmole |
| ethyl p-dimethylaminobenzoate | 0.8 mmole | — |
| N—phenylglycine | — | 0.8 mmole in 2 ml of ethanol |

The dopes were coated at a wet thickness of 300 microns on a copper support on a coating block maintained at 18° C. After 5 min, the temperature of the block was raised to 66° C. for 10 min. The coating was then placed in an oven at 90° C. for 10 min. Test strips were exposed for 180 sec through a Kodak T-14 step tablet having optical density increments of 0.15 and a polypropylene cover sheet using a "COLIGHT EXPOSURE I" device, which uses a 400 W medium-pressure mercury lamp. The expossed test strips were developed for 55 sec in a processing tank containing 1,1,1-trichlorethane, rinsed for 5 sec with fresh 1,1,1,-trichloroethane, rinsed with water and dried. As a control, an identical element was prepared and exposed identicallly, except that the coinitiator was 0.1 millimole of Michler's ketone and 0.8 millimole of benzophenone.

The results were that Example 1A had a speed, observed as the last solid step produced, which was over three* times faster than the speed of the control, and Example 1B had a speed that was seven times the speed of the control.

*The accuracy of all of the speeds herein reported is about +20%.

EXAMPLES 2-34

To demonstrate the effectiveness of various coumarins when used with various amines, the procedure of Example 1 was repeated, except that the co-initiator was the coumarin and the amine indicated in Table II**. (In some cases 0.04 millimole of the coumarin was used, it being found that no difference in speed resulted in varying the amount of coumarin from 0.08 to 0.04). In these and in all subsequent examples, to determine relative speeds the last solid step produced was compared with that produced when using the co-initiator 3,3'-carbonylbis(5,7-di-n-propoxycoumarin) plus ethyl p-dimethylaminobenzoate. After a number of repeated tests, this coinitiator composition was found to give an average speed of 3.5 times the speed of Michler's ketone and benzophenone. This result is given in Example 5. The comparison of relative speeds is more readily made against a fast "control" than it is against the much slower speed achieved by the actual control of Michler's ketone and benzophenone. However, since the actual state-of-the-art control is Michler's ketone and benzophenone rather than Example 5, all relative speeds were recalculated to be expressed compared to a relative speed of 1.0 for the example which used Michler's ketone and benzophenone.

**In those cases where slow speeds are reported, i.e., less than 0.4, exposures had to be increased to produce a measurable result for comparison. The increased exposure was then factored into the speed comparisons.

The examples have been arranged in Table II according to their resulting speed, as is explained hereinafter.

TABLE II

| Example | Coumarin | Amine |
|---|---|---|
| Part A | | |
| 2 | 3-(p-diethylaminocinnamoyl)-7-diethylaminocoumarin | N—phenylglycine |
| 3 | 3-(2-benzofuroyl)-7-diethyl aminocoumarin | N—phenylglycine |
| 4 | 3,3'-carbonylbis(7-diethyl aminocoumarin) | N—phenylglycine |
| | | 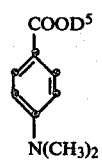 |
| Part B | | D[5] |
| 5 | 3,3'-carbonylbis(5,7-di-n-propoxycoumarin) | —C$_2$H$_5$ |

TABLE II-continued

| | | |
|---|---|---|
| 6 | 3,3'-carbonylbis(5,7-di-n-propoxycoumarin) | —$C_4H_9$ |
| 7 | 3,3'-carbonylbis(5,7-di-n-propoxycoumarin) | —$C_8H_{17}$ |
| 8 | 3,3'-carbonylbis(5,7-di-n-propoxycoumarin) | —$C_{12}H_{25}$ |
| 9 | 3,3'-carbonylbis(5,7-di-n-propoxycoumarin) | —$CH_2CH_2C_6H_5$ |
| 10 | 3,3'-carbonylbis(5,7-di-n-propoxycoumarin) | —$CH_2CH_2$—OOC—$\underset{\underset{CH_2}{\parallel}}{\overset{\overset{CH_3}{\mid}}{C}}$ |
| 11 | 3,3'-carbonylbis(5,7-di-n-propoxycoumarin) | N—phenylglycine |
| 12 | 3-benzoyl-7-methoxycoumarin | p-dimethylaminobenzaldehyde |
| 13 | 3-benzoyl-7-diethylamino coumarin | N—phenylglycine |
| 14 | 3-(p-morpholinostyrl carbonyl)-7-diethylamino coumarin | N—phenylglycine |
| 15 | 9-(7-diethylamino-3-coumarinoyl)1,2,4,5-tetrahydro-3H,6H,10H[1]benzopyrano-[6,7,8-i,j]quinolizine-10-one | N—phenylglycine |
| Part C | | |
| 16 | 3,3'-carbonylbis(5,7-di-n-propoxycoumarin) | ethyl p-(dimethylamino)benzoylacetate |
| 17 | 3,3'-carbonylbis(5,7-di-n-propoxycoumarin) | p-bromo-N,N—dimethylaminoaniline |
| 18 | 3,3'-carbonylbis(5,7-di-n-propoxycoumarin) | 2-chloro-4-dimethylaminobenzaldehyde |
| 19 | 3,3'-carbonylbis(5,7-di-n-propoxycoumarin) | p-piperidinoacetophenone |
| 20 | 3,3'-carbonylbis(5,7-di-n-propoxycoumarin) | 2-phenylethyl m-dimethylaminobenzoate |
| 21 | 3,3'-carbonylbis(5,7-di-n-propoxycoumarin) | pentamethylene bis-(p-dimethylaminobenzoate) |
| 22 | 3,3'-carbonylbis(5,7-di-n-propoxycoumarin) | N—methyl-N—phenyl-benzylamine |
| Part D | | |
| 23 | 3,3'-carbonylbis(5,7-di-n-propoxycoumarin) | 2-phthalimidoethyl p-dimethylaminobenzoate |
| 24 | 3,3'-carbonylbis(5,7-di-n-propoxycoumarin) | 2-phthalimidoethyl m-dimethylaminobenzoate |
| 25 | 3,3'-carbonylbis(5,7-di-n-propoxycoumarin) | pentamethylene bis (m-dimethylaminobenzoate) |
| 26 | 3,3'-carbonylbis(5,7-di-n-propoxycoumarin) | p-diethylaminobenzaldehyde |
| 27 | 3,3'-carbonylbis(5,7-di-n-propoxycoumarin) | dibenzylphenylamine |
| 28 | 3-benzoyl-7-methoxycoumarin | pentamethylene bis-(p-dimethylaminobenzoate) |
| Part E | | |
| 29 | 3,3'-carbonylbis(5,7-di-n-propoxycoumarin) | 3-ethoxy-N,N—diethyl-aniline |
| 30 | 3,3'-carbonylbis(5,7-di-n-propoxycoumarin) | N,N—bis(2-hydroxyethyl)aniline |
| 31 | 3-benzoyl-7-methoxycoumarin | 4,4',4''-methylidyne-(N,N—dimethylaniline) |
| 32 | 3-benzoyl-7-methoxycoumarin | tridodecylamine |
| 33 | 3-benzoyl-7-methoxycoumarin | tribenzylamine |
| 34 | 3,3'-carbonylbis(7-diethyl aminocoumarin) | inodole-3-ylactic acid |
| Part F | | |
| Control | 3-benzoyl-7-methoxycoumarin | 3,3'-carbonylbis(7-diethylaminocoumarin) |

All those examples listed in Part A of Table II were found to have a relative speed of between about 4 and about 6 and Part B a speed of between about 3 and about 3.5. Those of Part C had a speed of between about 2 and about 3, those of Part D between about 1.25 and about 2, and those of Part E between about 0.25 and about 0.8. Part F, a co-initiator described in the aforesaid U.S. Pat. No. 4,147,552 produced a speed of about 0.08.

Examples 35-41

To demonstrate further the effectiveness of various amino-coumarins when used with various amine activators, the coatings and exposure of Example 1 were repeated using the coumarins and amines of Table III as a co-initiator. The speeds, stated as in the previous examples relative to a speed of 1 for Michler's ketone and benzophenone, are given in Table III.

TABLE III

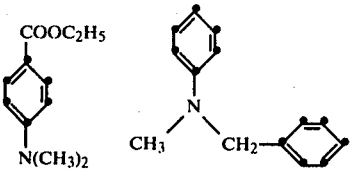

| | | Relative Speed For the Noted Amine | |
|---|---|---|---|
| Example | Coumarin | COOC₂H₅ / N(CH₃)₂ | CH₃ / CH₂— (pyrrolidine structure) |
| 35 | 3-(2-benzofuroyl) 7-diethylamino coumarin | 3.5 | 2.5 |
| 36 | 3-benzoyl-7-diethyl aminocoumarin | 0.4 | 0.5 |
| 37 | 7-dimethylamino-3-thenoylcoumarin | 1.2 | 0.9 |
| 38 | 7-diethylamino-3-(o-methoxybenzoyl)-coumarin | 0.5 | 0.6 |
| 39 | 7-diethylamino-3-(m-fluorosulfonyl-benzoyl)coumarin | 0.4 | 0.6 |
| 40 | 7-diethylamino-3-(p-dimethylaminobenzoyl)-coumarin | 0.08 | 0.2 |
| 41 | 3-(2-benzofuroyl)-7-(1-pyrrolidinyl) coumarin | 3.5 | 2.5 |

Examples 42-62

To demonstrate the use of the invention with additional acetic acid derivatives as the activator, Example 1 was repeated except that the coumarin and the activators selected were those indicated in the following table. All speeds are stated relative to an arbitrary speed of 1.0 for the results obtained when using, as a control co-initiator, Michler's ketone and benzophenone.

TABLE IV

| Example | Coumarin | Activator | Relative Speed |
|---|---|---|---|
| 42 | 3-(p-methoxybenzoyl)-5,7-di-n-propoxy-coumarin | 2,5-dimethoxy-phenylacetic acid | 0.4 |
| 43 | 3-(p-methoxybenzoyl)-5,7-di-n-propoxy-coumarin | 3,4-dimethoxy-phenylacetic acid | 0.4 |
| 44 | 3-(p-methoxybenzoyl)-5,7-di-n-propoxy-coumarin | 4-methoxyphenoxy acetic acid | 1.05 |
| 45 | 3-benzoyl-5,7-di-n-propoxycourmarin | 2,5-dimethoxy-phenylacetic acid | 0.72 |
| 46 | 3-benzoyl-5,7-di-n-propoxycoumarin | 3,4-dimethoxy-phenylacetic acid | 0.53 |
| 47 | 3-benzoyl-5,7-di-n-propoxycoumarin | 4-methoxyphenoxy acetic acid | 1.22 |
| 48 | 3-(p-cyanobenzoyl)-5,7-di-n-propoxycoumarin | 2,5-dimethoxy-phenylacetic acid | 1.65 |
| 49 | 3-(p-cyanobenzoyl)-5,7-di-n-propoxycoumarin | 3,4-dimethoxy-phenylacetic acid | 1.65 |
| 50 | 3-(p-cyanobenzoyl)-5,7-di-n-propoxycoumarin | 4-methoxyphenoxy acetic acid | 2.7 |
| 51 | 3-(p-cyanobenzoyl)-5,7-di-n-propoxycoumarin | 3,4,5-trimethoxy-phenoxyacetic acid | 1.1 |
| 52 | 3-(p-cyanobenzoyl)-5,7-di-n-propoxycoumarin | 2,3,4-trimethoxy-phenoxyacetic acid | 0.45 |
| 53 | 3-(p-cyanobenzoyl)-5,7-di-n-propoxycoumarin | 2-(phenylthio)acetic acid | 0.9 |
| 54 | 3-(p-cyanobenzoyl)-5,7-di-n-propoxycoumarin | phenoxyacetic acid | 0.6 |
| 55 | 3-(p-cyanbenzoyl)-5,7-di-n-propoxycoumarin | 4-methoxyphenyl-acetic acid | 0.8 |
| 56 | 3-(p-nitrobenzoyl)-5,7-n-propoxycoumarin | 2,5-dimethyoxyphenyl-acetic acid | 0.35 |
| 57 | 3-(p-nitrobenzoyl)-5,7-di-n-propoxycoumarin | 3,4-dimethoxyphenyl acetic acid | 0.32 |
| 58 | 3-(p-nitrobenzoyl)-5,7-di-n-propoxycoumarin | 4-methoxyphenoxy acetic acid | 0.8 |
| 59 | 3,3'-carbonylbis(5,7-di-n-propoxycoumarin) | 2,5-dimethoxyphenyl-acetic acid | 1.68 |
| 60 | 3,3'-carbonylbis(5-7-di-n-propoxycoumarin) | 3,4-dimethoxyphenyl-n-propoxycoumarin) acetic acid | 1.6 |
| 61 | 3,3'-carbonylbis(5,7-di-n-propoxycoumarin) | 4-methoxyphenoxy acetic acid | 2.9 |
| 62 | 3,3'-carbonylbis(5,7-di-n-propoxycoumarin) | 2-(4-methoxyphenyl thio)acetic acid | 1.53 |

Examples 63-66

The formulation and testing of Example 47 were repeated using, however, the 3-ketocoumarins of Table V.

TABLE V

| Example | Photosensitizer | Relative Speed |
|---|---|---|
| 63 | 3-benzoyl-7-methoxycoumarin | 1.5 |
| 64 | 7-dimethylamino-3-thenoyl)-coumarin | 1.2 |
| 65 | 7-diethylamino-3-(2-benzo[b]-furoyl)coumarin | 2.6 |
| 66 | 3-(p-cyanobenzoyl)-7-diethyl-aminocoumarin | 0.27 |

Examples 67–71  Additional Acetic Acid Derivative Activators

Examples 63–66 were repeated using, however, the photosensitizers and the acetic acid derivative activators of Table VI.

TABLE VI

| Example | Photosensitizer | Activator | Relative Speed |
|---|---|---|---|
| 67 | 3,3'-carbonylbis(5,7-di-n-propoxycoumarin) | p-methoxy-thiophenoxy acetic acid | 1.5 |
| 68 | 3,3'-carbonylbis(5,7-di-n-propoxycoumarin) | (1-naphthyl) thioacetic acid | 0.5 |
| 69 | 3-(p-cyanobenzoyl)-5,7-di-n-propoxycoumarin | (2-thienyl) acetic acid | 0.2 |
| 70 | 3-(p-cyanobenzoyl)-5,7-di-n-propoxycoumarin | (2-naphthyl) acetic acid | 0.2 |
| 71 | 3-(p-cyanoenzoyl)-5,7-di-n-propoxycoumarin | 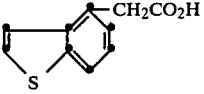 | 0.3 |

Example 72

To demonstrate the use of the invention with 2,3-bornanedione as the activator, Example 1 was repeated using a dope containing 0.1 mmole of 2,3-bounanedione and 0.1 mmole of 3-(2-benzofuroyl)-7-diethylaminocoumarin. The relative speed result, compared to a speed of 1 for the same dope using, however, Michler's ketone and benzophenone, was 0.78.

By way of contrast, when this example was repeated but with 0.1 mmole of 7-diethylamino-4-methylcoumarin as the photosensitizer in the manner taught by U.S. Pat. No. Re. 28,789 reissued on April. 27, 1976, the speed result was only 0.32 compared to a speed of 1.0 for Michler's ketone and benzophenone.

Examples 73 and 74

To demonstrate the effectiveness of phosphines as the activator, the coatings and exposure of Example 1 were repeated except that 3,3'-carbonylbis(5,7-di-n-propoxycoumarin) and equimolar amounts of triphenylphosphine, Example 73, and tritolylphosphine, Example 74, were used as the ketocoumarin and the activators. The speed of Example 64 was 0.56 and that of Example 65 was 0.34, compared to a speed of 1.0 for Michler's ketone and benzophenone.

Example 75

To demonstrate the effectiveness of stibines as the activator, the coatings and exposure of Example 74 were repeated except that an equimolar amount of triphenylstibine was tested as the activator. The relative speed was 0.29.

Examples 76–80

To demonstrate the invention for use with different monomers, a stock solution was prepared as follows:

| | |
|---|---|
| "Acryloid A-11" | 60 g |
| "Acryloid B-48N" | 60 g |
| 3,3'-carbonylbis(5,7-di-n-propoxycoumarin) | 1.5 g |
| ethyl p-dimethylaminobenzoate | 1.5 g |
| t-butyl pyrocatechol | 0.525 g |
| dichloromethane | 278.6 g |

To 39.11 g of the stock solution, 5.25 g of the following monomers were added:

| Example | Monomer |
|---|---|
| 76 | tetraethylene glycol diacrylate |
| 77 | 1,6-hexanediol diacrylate |
| 78 | triethylene glycol dimethacrylate |
| 79 | tetraethylene glycol dimethacrylate |
| 80 | diethylene glycol dimethacrylate |

Each example was then coated onto a copper foil which had a thickness of 35 microns to provide a wet thickness of 300 microns. The dry coating was approximately 75 microns thick.

All coatings were exposed to a Colight I exposing unit equipped with a 400 W medium-pressure lamp, for 2 min through a T-14 step tablet having increments of 0.15 density, followed by a 1-min spray development in 1,1,1-trichloroethane and a water rinse. The speeds of the coated resist were measured as the last observed solid step after development and were as follows:

| Example | Speed |
|---|---|
| 76 | 12+ |
| 77 | 10+ |
| 78 | 10– |
| 79 | 10 |
| 80 | 9 |

Example 81

As an example of the extremely fast speeds which can be obtained, a composition similar to that tested in Example 1, but without the plasticizer dibutyl phthalate, was prepared and shown to have a speed as follows:

| Ketocoumarin | Activator | Relative Speed* |
|---|---|---|
| 0.08 mmole of 3-(2-benzo-furoyl)-7-diethylamino coumarin | 0.8 mmole of N—methyl-3-indole acetic acid | 10.6 |

*compared with a speed of 1.0 for Michler's ketone and benzophenone.

Example 82

This example demonstrates the use of substituted latex prepared from poly(methyl methacrylate-co-N,N-dimethylaminoethyl methacrylate-co-2-hydroxyethyl methacrylate-co-2-acrylamido-2-methylpropanesulfonic acid, and poly(methyl methacrylate-co-2-methyl-1-vinylimidazole) fully quaternized with chloromethylcarbonyloxyethyl methacrylate.

Part A - Preparation of Latex

The latex was prepared as follows:

In a dropping funnel was placed:

| | |
|---|---|
| methyl methacrylate | 20. ml |
| N,N—dimethylaminoethyl methacrylate | 31. ml |
| 2-hydroxyethyl methacrylate | 10. ml |
| 2-acrylamido-2-methylpropanesulfonic acid (as 10% w/v aqueous solution adjusted to pH 5) | 10. ml |
| sodium metabisulphite | 1.0 g |
| surfactant MDP | 0.5 g |
| distilled water | 40. ml |

In the reaction flask was placed:

| | |
|---|---|
| potassium persulphate | 4.8 g |
| sodium metabisulphite | 1.8 g |
| surfactant MDP | 0.8 g |
| distilled water to | 100. ml |

(Surfactant MDP is a copolymer of acrylamide and carbowax 550 acrylate (obtained from Union Carbide) (8:1).

Procedure

The polymerization was carried out at 80° C. in a reaction vessel equipped with stirrer, dropping funnel and nitrogen inlet. Nitrogen blanketing was one of three measures taken against inhibition by oxygen. In addition, the distilled-water solvent was boiled and purged with nitrogen before use, and there was a scavenging period of 15 min where the contents of the reaction vessel were stirred at 80° C., generating a radical flux from the initiators, before monomer addition started.

The contents of the dropping funnel were added over a period of 1 hr and the reaction mixture was then stirred for a further 4 hr. The crude latex was filtered through muslin to remove coagulum before being dialysed against water for 24 hr. The latex was then filtered once more before storage.

As described in commonly owned U.S. application Ser. No. 44,273 filed on May 31, 1979, the quaternized polymer latex was then prepared by adding 10.4 g of the copolymer of Part A and 10.3 g of chloromethylcarbonyloxyethyl methacrylate to 100 ml of dimethylformamide. The solution was placed in a 250-ml flask placed in a thermostatted bath at 95° C. After heating overnight, the polymer was isolated by precipitation into ether, dried under vacuum and redissolved in methanol. The polymer was isolated by reprecipitation into ether, collected and dried (15 g).

($C_{19}H_{27}ClN_2O_6$)n: Required: Cl 8.56%; Found: Cl 7.70%.

Part B - Preparation of Composition

The following coating solution was prepared:

| | |
|---|---|
| poly(methyl methacrylate-co-2-methyl-1-vinylimidazole) fully quaternized with chloromethylcarbonyloxyethyl methacrylate as described in Part A above | 0.8 g in 6 ml of water hereinafter "Latex" |
| 3-(7-methoxy-3-coumarinoyl)-1-methylpyridinium p-toluenesulfonate (hereinafter MCMTS) | 0.1 g |
| latex | 4 ml |
| water to provide a total of | 12 ml |
| anionic surfactant | ca. 3 drops |

The above solution was coated onto a 17.78 cm by 17.78 cm grained phosphoric acid anodized foil (unsubbed) on a whirler coater machine at 90 rpm. The plate was spun for 3 min at room temperature and then for 12 min at 35° C.

Part of the plate was then exposed in a vacuum frame, through a 0.15 density increment step tablet, to four 125 w high-pressure mercury vapor lamps at a distance of 45.7 cm for 4 min.

The exposed coating was then developed in substantially pure water. After removal of the unexposed areas the nonimage areas were desensitized with Kodak Polymatic Finisher. On inking, the last step of the table to ink up was recorded as 10.

Examples 83–95 - Acetic Acid Derivative Activators Used With Other Photosensitizers To demonstrate the invention using acetic acid derivative activators, together with photosensitizers other than ketocoumarins, the formulation and testing of Example 47 were repeated except that the photosensitizer was as indicated in Table VII.

TABLE VII

Photosensitizer

| Example | X | Relative Speed |
|---|---|---|
| 83 | H | 1.3 |
| 84 | Cl | 3.0 |
| 85 | Br | 2.8 |
| 86 | CN | 1.1 |
| | | 1.1 |

| | $R^1$ | $R^2$ | |
|---|---|---|---|
| 87 | —phenyl | H | 0.38 |
| 88 | —⟨benzene⟩—COOCH$_3$ | H | 0.2 |
| 89 | —⟨thiophene⟩ | H | 0.26 |
| 90 | —phenyl | —CN | 0.2 |
| 91 | | | 0.3 |

TABLE VII-continued

| | | |
|---|---|---|
| 92 | [structure with CN, S, phenyl groups, C=O] | 0.5 |
| 93 | CH₃-N(CH₃)-[phenyl]-C(=O)-CH=CH-[phenyl]-CN | 0.3 |
| 94 | [anthraquinone-like structure with two C=O] | 0.65 |
| 95 | 3-(4-cyanophenyl)-2-(4-ethoxybenzoyl-5-ethoxyphenylthiophene | 0.2 |

EXAMPLES 96-102-Ketone Activators

To demonstrate the effectiveness of ketones as the activator, the coatings and exposure of Example 1 were repeated except that equimolar amounts of the ketones of Table VIII were tested, along with 3,3'-carbonylbis (7-diethylaminocoumarin) as the photosensitizer. The relative speeds are listed in the Table.

TABLE VIII

| Example | Activator | Relative Speed* |
|---|---|---|
| 96 | fluorenone | 0.65 |
| | [fluorenone structure with X substituent] | |
| 97 | X = H | 1.1 |
| 98 | X = Br | 0.8 |
| 99 | X = CN | 1.9 |
| 100 | [decafluorobenzophenone structure] | 0.4 |
| 101 | [dibenzoylmethane-like structure with CN] | 0.7 |
| 102 | [H₅C₆-CO-CH=C(-CO-)-C₆H₅ structure] | 0.4 |

*1.0 = speed when using Michler's ketone plus benzophenone.

Comparative Examples 1-7

The formulation and procedure of Example 47 were repeated, except using the photosensitizers noted in Table IX. The co-initiator composition which resulted was unable to produce a relative speed of at least 0.2 that achieved when using Michler's ketone and benzophenone.

TABLE IX

| Comp. Ex | Photosensitizer | Relative Speed |
|---|---|---|
| 1 | xanthone | much less than 0.2 |
| 2 | 4,4'-dicyanochalcone | much less than 0.2 |
| 3 | 2-(4-cyanobenzylidene)-1,3-indandione | <<0.2 |
| 4 | 2,6-bis(4-cyanobenzylidene)cyclohexanone | <<0.2 |
| 5 | 3,3'-carbonylbis (7-diethyl-aminocoumarin | 0.1 |
| 6 | 3-(p-diethylaminobenzoyl)-7-diethylaminocoumarin | 0.15 |
| 7 | 2-(4-cyanobenzoylmethylene)-1-methylnaphtho [1,2-d]thiazoline | 0.16 |

The invention has been described in detail with particular reference to preferred embodiments thereof, but it will be understood that variations and modifications can be effected within the spirit and scope of the invention.

What is claimed is:

1. In a photopolymerizable composition comprising an addition-polymerizable compound containing ethylenic unsaturation and a co-initiator composition comprising a photosensitizer and a photopolymerization activator responsive in the presence of the photoexcited form of said photosensitizer to form a free radical;

the improvement wherein said activator has the structure:

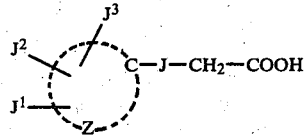

wherein:
J is —O—, —S— or a carbon-to-carbon bond;
J¹, J², and J³ are each independently hydrogen; alkyl, alkoxy, or alkylthio having from 1 to 5 carbon atoms; aryloxy having from 6 to 10 carbon atoms; halogen; or any two of J¹, J², and J³ taken together comprise the atoms necessary to complete a 5- or 6-membered fused heterocyclic or aromatic ring; and
Z is the number of atoms necessary to complete a heterocyclic or aromatic ring of from 4 to 6 ring atoms;
said activator and said photosensitizer being present in an amount sufficient to provide, when the composition is coated, dried and exposed to a medium-pressure mercury light source, a speed which is at least about one-fifth that of the same composition coated, dried and exposed identically except with a co-initiator consisting of Michler's ketone and benzophenone.

2. A composition as defined in claim 1, wherein said photosensitizer includes a polar substituent, whereby said photosensitizer is soluble in polar solvents.

3. A composition as defined in claim 1, and further including a support on which said composition is disposed to provide a radiation-responsive element.

4. A composition as defined in claim 1, wherein said activator is p-methoxyphenoxy acetic acid.

5. A composition as defined in claim 1, wherein said photosensitizer is a 3-ketocoumarin.

6. A composition as defined in claim 1, wherein said photosensitizer is a bis-3-ketocoumarin.

7. A composition as defined in claim 1, wherein said photosensitizer is a 3-(substituted benzoyl)-5,7-dialkoxycoumarin, the substituents on the benzoyl group being selected from the group consisting of alkoxy of from one to four carbon atoms, nitro and cyano.

8. A composition is defined in claim 5, wherein said photosensitizer is 3-(4-cyanobenzoyl)-5,7-di-n-propoxycoumarin.

* * * * *